United States Patent [19]
Whittaker et al.

[11] Patent Number: 5,822,334
[45] Date of Patent: Oct. 13, 1998

[54] HIGH SPEED INITIALIZATION SYSTEM FOR RAM DEVICES USING JTAG LOOP FOR PROVIDING VALID PARITY BITS

[75] Inventors: Bruce Ernest Whittaker, Mission Viejo; James Henry Jeppesen, III, Lake Forest, both of Calif.

[73] Assignee: Unisys Corporation, Blue Bell, Pa.

[21] Appl. No.: 583,377

[22] Filed: Jan. 5, 1996

[51] Int. Cl.[6] .................................................. G06F 11/00
[52] U.S. Cl. .................................... 371/22.3; 395/183.06
[58] Field of Search .................. 371/22.3, 27; 324/73.1, 324/156 R; 395/183.06

[56] References Cited

U.S. PATENT DOCUMENTS 5,526,365  6/1996  Whetsel ................................. 371/22.3

*Primary Examiner*—Vincent P. Canney
*Attorney, Agent, or Firm*—Alfred W. Kozak; Mark T. Starr; Steven R. Petersen

[57] ABSTRACT

A computer network having a Control Processing Module (CPM) maintained by an external Maintenance Subsystem where the CPM has JTAG compatible digital units, but where the Cache Module is not JTAG compatible. Specialized transceivers having Boundary Scan Registers are activated to enable loading of address words in a Tag RAM while concomitantly placing correct initial parity data in a Parity RAM without need to continue communication with the external Maintenance Subsystem. The Boundary Scan Registers in said transceivers are set up to perform as up-counters to sequence through all address locations in the Tag RAM while a Control PAL calculates and places the associated parity values in each corresponding address location in the Parity RAM.

7 Claims, 6 Drawing Sheets

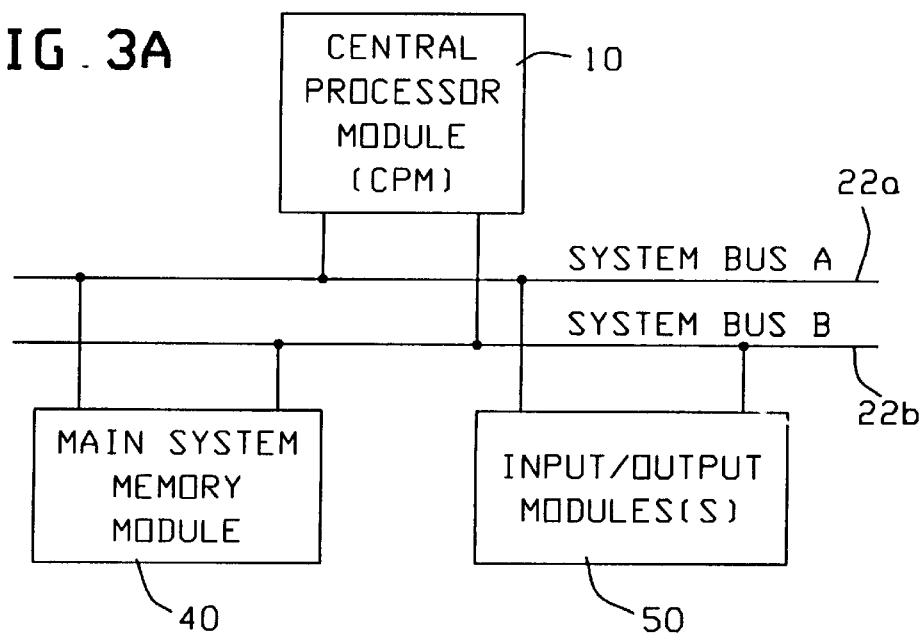
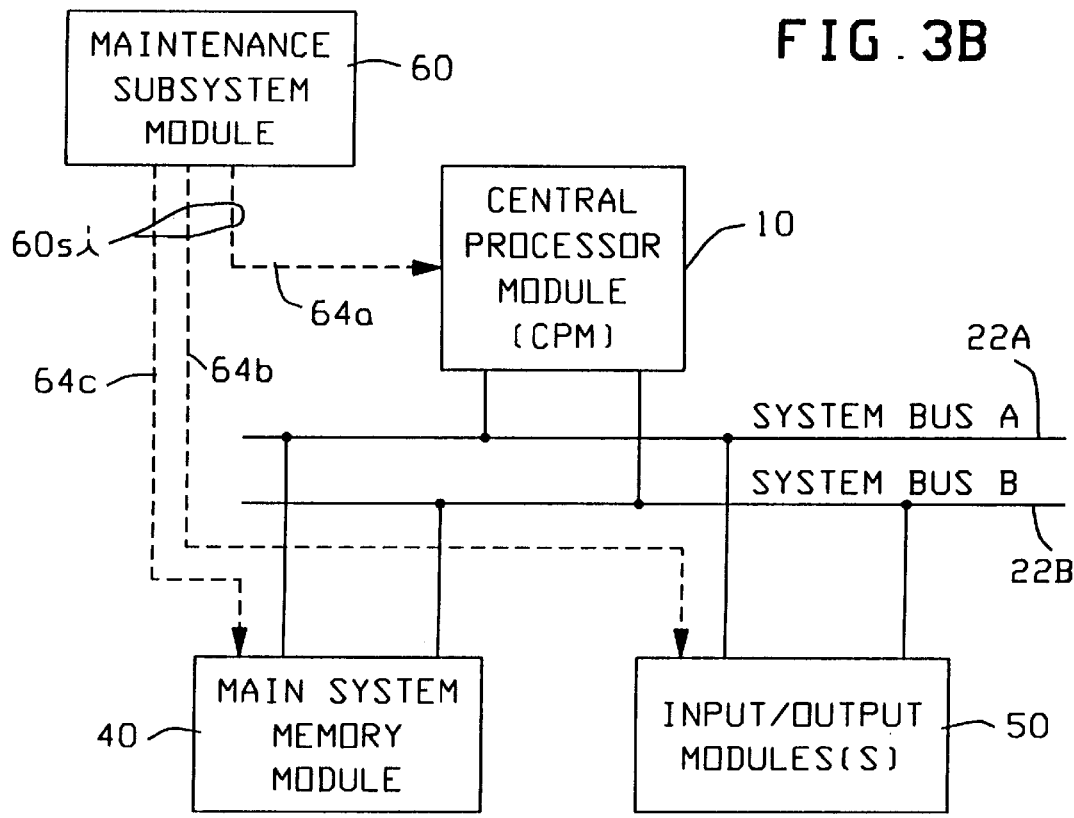

| DATA WORD VALUES FOR RAM INITIALIZATION | PARITY BITS VALUE |
|---|---|
| BYTE A = 0000 0000 | x = 1 |
| BYTE B = 0000 0000 | y = 1 |
| STATUS = 00 | w = 1 |
| A+B = 1+1 = 0 | z = 0 |

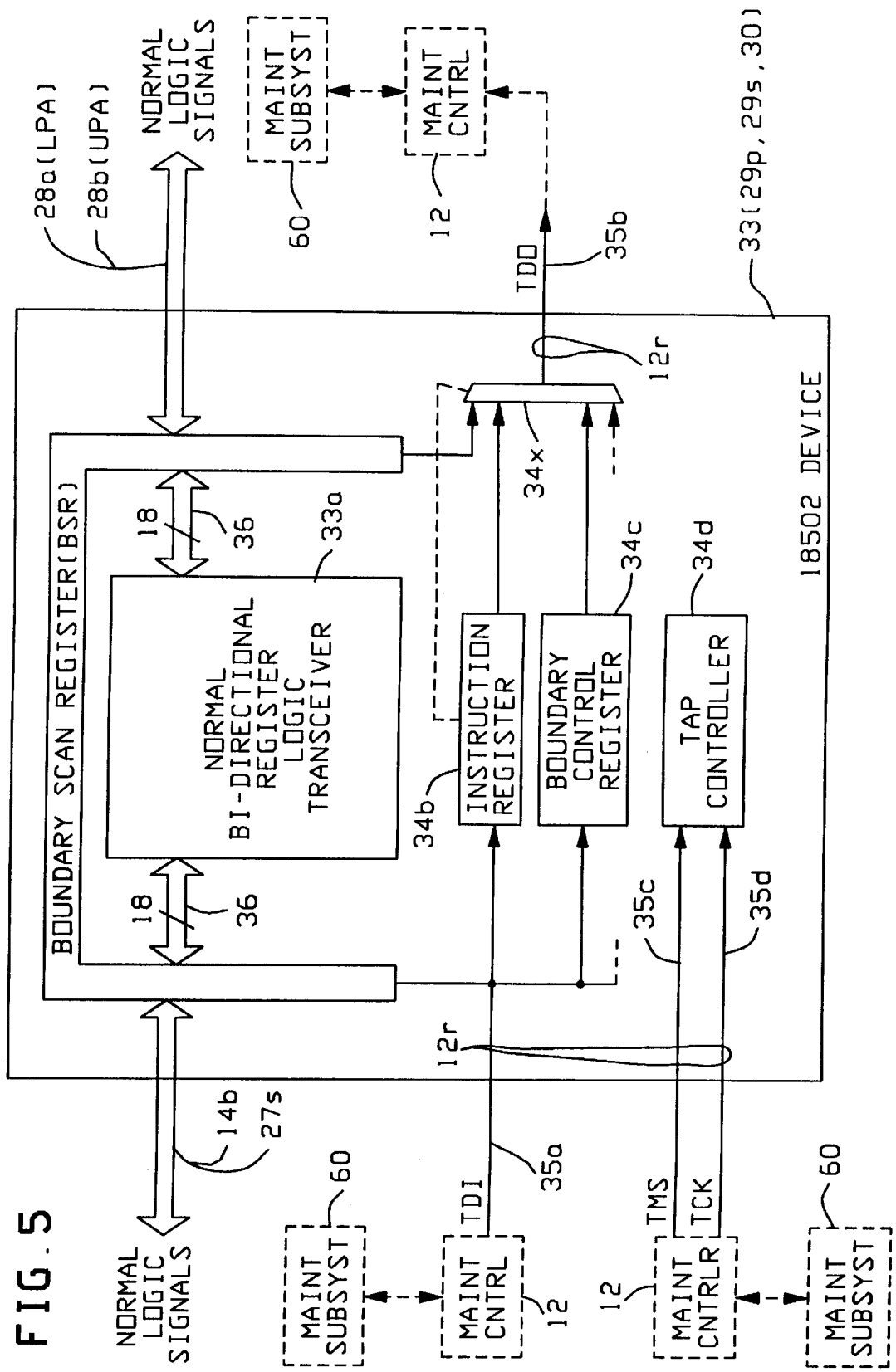

HIGH SPEED INITIALIZATION SYSTEM FOR RAM DEVICES USING JTAG LOOP FOR PROVIDING VALID PARITY BITS

FIELD OF THE INVENTION

This disclosure relates to digital systems providing rapid initialization of on-card RAM devices which will carry valid parity bits at the outset.

BACKGROUND OF THE INVENTION

FIG. 3A is a diagram of a simplified picture of a digital computing system with the basic elements of a Central Processing Module 10, a Main System Memory module 40 and an Input/Output module or modules 50. These modules are shown interconnected via a special dual system bus structure having system bus A, 22a and system bus B 22b connected to each of the modules. These busses provide two identical and interchangeable system busses which provide concurrent transfer capability and redundancy.

FIG. 3B shows an expanded digital system over that of FIG. 3A by including the necessary Maintenance Subsystem module 60. The Maintenance Module 60 provides both diagnostic functions to all system modules, but is also required to "initialize" all of the system modules, set up the initial parameters and "start up" the system for operation. The Maintenance Subsystem 60 is shown connecting to all the system modules via bus 60si having a dashed line set of connections, 64a, 64b, and 64c. These dashed lines represent the basic connections of the diagnostic JTAG type system which is specified in IEEE 1149.1. This is an industry-standardized interface which provides a bit serial data transfer on bus 60si, providing connection between the various target modules in the system and the maintenance subsystem 60. It is through this bit serial interface 60si that all of the system modules are set-up (initialized) for system operation. The serial interface 60si is a system compromise between cost and performance. It is inexpensive in cost since it is standard and only requires five wires, since it is a bit serial data transfer system. However, there is a certain liability in the speed of data transfer in such a system, since the bit serial interface 60si is a relatively slow data transfer system which does not compare to the transfer speed of high speed busses. Thus in diagnostic operations on the sub-lines 64a, 64b, and 64c to various of the digital modules, will be seen to be slow in transfer rate.

Thus, if massive amounts of information must be transferred, the use of the serial bus interface 60si of FIG. 3B will take a considerably long and painstaking time in terms of relative speed of computer operations.

An important part of the system initialization operation is the initialization of RAM structures in the system. Numerous RAM storage structures generally exist in digital systems. For example, the input/output processor module 50 of FIGS. 3A, 3B may use RAMs as high speed intermediate buffers between the various peripheral devices to which it connects and to the system main memory 40.

The central processor module 10 (CPM) may also use RAMs for several different functions. These includes, for example, "register file" structures for fast temporary holding registers. Also, a use can be made for "monitor memory" structures which involve on-card memory which hold the history of various important data and address values to aid in system maintenance and recovery. Further, the central processor module 10 may use RAMs as on-card cache memory modules which can used several different RAM structures for "Tag" and "Data" memory units.

Whatever the specific function of the RAM structure involved, it is usually necessary for the system to start out with some "known" values as being stored in the RAM devices. At the moment of "power-on" of the system, usually the RAM devices involved will hold "unknown" values. Thus, upon system initialization, there must be some means to put some "known" values into these structures.

Additionally, and very importantly, if parity checking is done on the RAN structures, and this is a very normal operation for digital systems, then "known" values for the parity bits and for the data bits held in the RAMs must be stored at initialization time to prevent false parity error detection when the RAMs are first read out and checked.

The maintenance subsystem 60, FIG. 3B, can initialize RAM structures in several ways. The system and method presented herein is a method using a JTAG function which comes already in existence with standard JTAG devices and can be utilized to initialize RAM structures which are not normally JTAG devices. And this method can be implemented in a rapid and efficient matter which can complete its operation many times faster than the earlier designed types of systems' capabilities.

Thus, the problem presented involves the question of how to initialize a computer system's RAM structures to "known" values with valid "initial" parity in a time-efficient manner. The present system and method eliminates the slow serial maintenance paths which were used in the standard costly, time-consuming architectures and instead uses the pre-existing JTAG features to advantage in handling the problem of initializing RAM devices with valid parity in milliseconds.

SUMMARY OF THE INVENTION

A system and method is provided for the rapid loading of RAM storage devices in digital systems which also involve the establishment of parity values so that a rapid initialization setup is possible with "known" values in the RAM devices, instead of "unknown" values, which will enable the system to be operable in a small fraction of time.

The RAM device modules existent in a digital system can be written to and the parity values can be placed in a "known" condition in a rapid fashion, after initialization by a maintenance subsystem, by using special features of bi-directional register transceivers, such as is typical of the Texas Instruments Company's 18502 unit. By using a JTAG boundary control register (BCR) in the register-transceiver device which can cause certain device pin outputs to act in a "binary up counter" sequence, the necessary addressing of the various RAM module units can be effectuated without the need to use slow-working transfer-rate serial interfaces from the maintenance subsystem. Thus, the maintenance subsystem, after its initial start of initialization, can be bypassed and the central processing module (CPM) with its RAM devices can be self-operative to write in the appropriate addresses and data into the RAM devices and also provide the known proper values of parity which are required so that the system will be ready for operation in a short few milliseconds of time.

When the maintenance subsystem starts to shift-in the instructions for running a boundary control test (RUNT), then a boundary scan register (BSR) will operate to count as a "boundary up-counter" at each clock time. The use of multiple bi-directional register-transceiver devices permits addresses and data and parity bits to be written into the RAM devices under the direction of a programmable array logic unit designated as the Control PAL.

Once the maintenance subsystem sets up the Write data for a Tag RAM and a parity RAM together with the proper control signals, the RAM devices and the programmable array logic, (Control PAL) and the bi-directional register-transceivers will be put into a mode designated "EXTEST." This mode will drive out the shifted boundary scan register (BSR) values on to certain connection busses after which a particular bi-directional register-transceiver will run a boundary control register function which causes it to operate a binary up count output operation. Thus, in a few milliseconds, all address locations in the RAM devices will have been written-to and the proper known values of parity, in the parity RAMs involved, will have the proper initialized values for proper operation of the system.

BRIEF DESCRIPTION OF THE DRAWINGS

FIG. 3A is a basic diagram of a digital computing system and its external modules;

FIG. 3B shows a basic digital system connected to a maintenance subsystem module;

FIG. 5 is a basic drawing of a commercially known transceiver.

DESCRIPTION OF PREFERRED EMBODIMENT

Figure 3C:
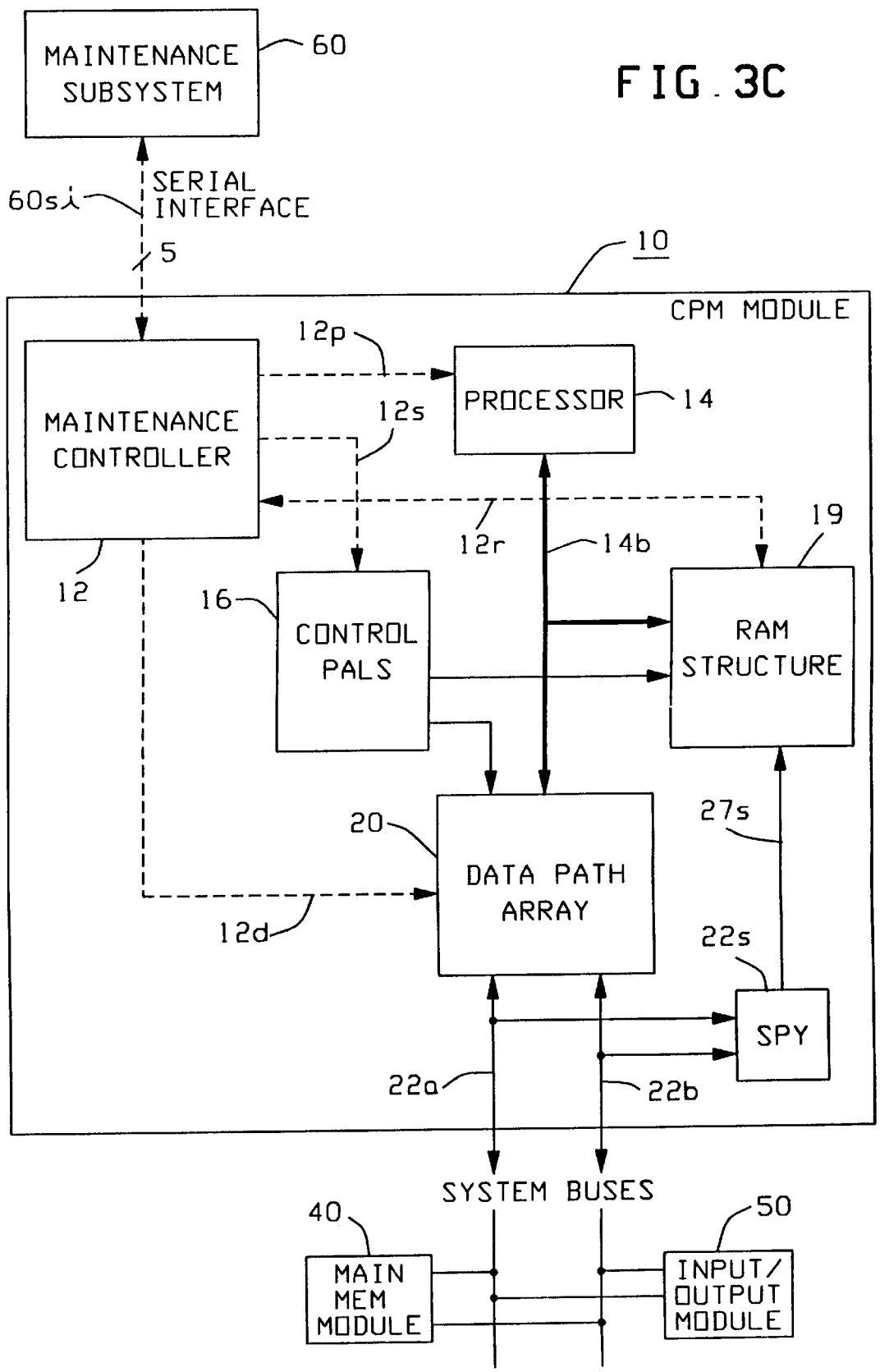
FIG. 3C is drawn to indicate the various basic elements in the Central Processing Module which are maintained by the maintenance subsystem.

As was indicated in FIG. 3C, the Central Processing Module 10 (CPM) is seen in an expanded version to include certain specific internal blocks. The serial interface from the Maintenance Sub-system 60 to the Central Processing Module 10 is shown on bus 60si. The serial interface connects to a Maintenance Controller 12 in the CPM 10. The Central Processing Module includes the processor 14, the data path array 20, the Programmable Array Logic or Control PAL 16 and a generalized block called the RAM Structure 19. The RAM Structure 19 shown in FIG. 3C could be a "portion" of the on-card cache memory, where the Tag memory cache 19p in FIG. 1 holds address pointers (address data words) and the Parity RAM 19p holds parity bit values to indicate the location and condition of data words in a Data RAM 19d. However, any RAM structure could utilize the features which are presented in the presently disclosed system. In FIG. 3C the on-card connections of the serial JTAG lines are shown as dashed lines 12p, 12c, 12r, and 12d. These maintenance connections are used to initialize the various logic blocks in the CPM 10 including the RAM structure 19.

Figure 1:
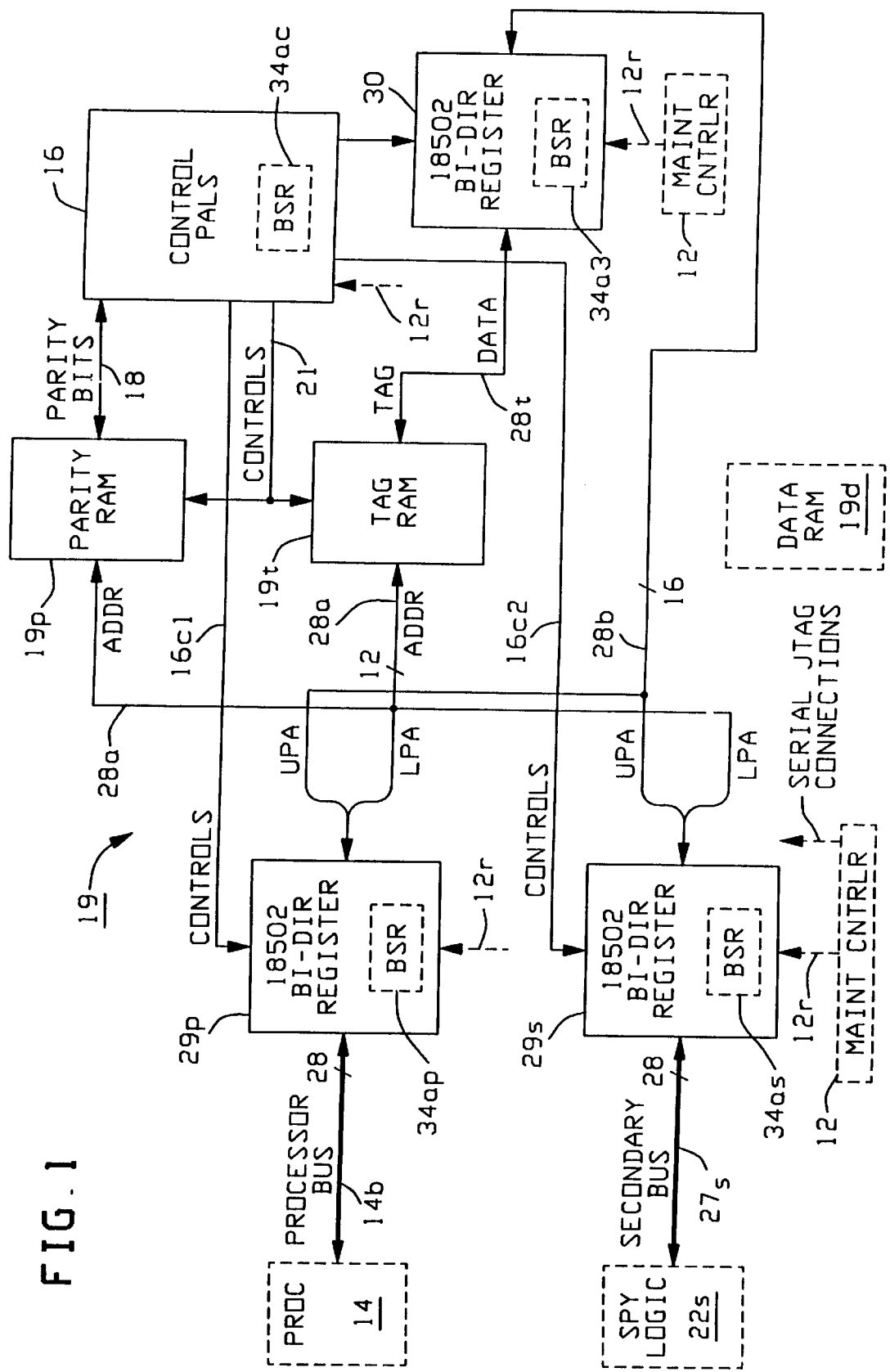
FIG. 1 is a diagram of the RAM structure of the present invention which can be initialized using bi-directional register-transceivers.

Referring to FIG. 1, there is seen an expanded view of the RAM structure 19 previously seen in FIG. 3C in the Central Processing Module 10. The incoming processor bus 14b is seen connected to the bi-directional register transceiver 29p. The transceiver 29p is controlled by the Control PAL 16 via control lines 16c1 and also provides address connections to the Tag RAM 19t, via bus 28a.

The secondary bus 27s from spy logic 22s connects to a bi-directional register transceiver 29s which is controlled on lines 16c2 by the Control PAL 16. Further the transceiver 29s has a LPA (Lower Partial Address) line to send addresses to the parity RAM 19p in addition to sending addresses on line 28b to register 30 via the UPA line. LPA represents the lower partial address, while UPA represents the upper partial address from processor 14 and spy logic 22s.

As seen in FIG. 1, either the processor bus 14b or the secondary bus 27s can access the RAM structure 19. The Control PAL 16 directs the traffic on the RAM structure internal busses designated 28b (UPA) and 28a (LPA). These two busses are shown for exemplary purposes. However, it is possible that more than two bus connections could be provided for enabling access to the RAM structure 19.

Bus Isolation Devices:

In FIG. 1, there are two bi-directional bus transceivers 29p and 29s used for isolation purposes. These devices are standard off-the-shelf chips from Texas Instruments Corporation of Dallas, Tex. and are designated SN74ABT18502. These transceivers 29p and 29s of FIG. 1 provide isolation between the various busses (processor bus 14b, secondary bus 27s, UPA 28b, and LPA 28a) and also allow the Control PAL 16 to steer data from, and steer data to, the appropriate bus or the appropriate RAM unit 19p, 19t, as required. Further, these transceiver devices 29p, 29s, act as holding registers of bus information from busses 14b and 27s until data can be steered to its required destination.

The transceiver chips 29p, 29s, and chip 30 are also full JTAG compliant for maintenance purposes. The serial JTAG connections shown on lines 12r to each of the devices in FIG. 1, is through the use of those JTAG utility lines connected to the transceiver devices which provide a special feature of the presently disclosed operating system. A boundary scan register (BSR) as seen in FIG. 5 is part of each transceiver and these are designated in FIG. 1 as 34ap, 34as, 34a3.

As with any multiple bus, bi-directional structure, it is necessary to provide some type of isolation and steering logic. It is possible that large multiplexer devices could be used, but this would require numerous multiple-type devices and would not provide the helpful "registering" which is provided in the present system by the transceiver chips 29p and 29s and 30. The transceiver chips used here provide the "wire-OR'ing" of the processor bus 14b inputs and the secondary bus 27s inputs on to the internal busses UPA 28b and LPA 28a. The transceiver chips, or something equivalent, would be necessary to build a multiple-sourced structure. However, by selected usage of these transceiver devices, the system has provided a special feature without additional cost and for free use using elements already in the system.

Also seen in FIG. 1 is the internal RAM structure busses. These are the incoming busses 14b and 27s. These busses are split-off to form the internal busses 28a, 28b. The lower 12-bits of the incoming busses become the LPA bus 28a (12 bits). This bus 28a provides the actual address to the RAM structure 19 (19p and 19t) itself. The JTAG connection for the RAM structure 19 is derived from the 16-bit UPA bus 28b.

Control PAL Logic 16:

The Programmable Array Logic shown as Control PAL 16 provides several items for the RAM structure 19. First, it provides the logic to control the reading and the writing of the RAM devices 19p, 19t. It also holds a JTAG boundary scan register 34ac. Further, the Control PAL 16 provides control signals to the RAM devices as shown by the control signals in Table I.

TABLE I

Control Bus (21) Signals and Signals
for Transceiver Registers (FIG. 1)

| | |
|---|---|
| TAG_OEB<br>Control Bus 21<br>from Control<br>PAL 16 (FIG. 1) | Signal used for reading the Tag RAM device 19t. This signal is the output enable allowing the RAM device to drive out onto the TAG bus 28t, the data stored at the location addressed by the LPA bus 28a. |
| TAG_WRB<br>Control Bus 21<br>from Control<br>PAL 16 | Signal used for writing into the Tag RAM device 19t. This signal is the write enable causing the RAM device to store the data value on the TAG bus 28t at the location addressed by the LPA bus 28a. |
| WRITESTA<br>Control Bus 21<br>from Control<br>PAL 16 | Signal used to control reading or writing of the parity RAM device 19p. When this signal is low, the RAM is outputting the parity bits on bus 18 stored in location addressed by the LPA bus 28a. When this signal is high, then the RAM 19p device is able to receive, as possible write data, the parity bits on bus 18. |
| PAR_WEB<br>Control Bus 21<br>from Control<br>PAL 16 | Signal used to enable writing to the Parity RAM device 19p. Data on the parity bits bus 18 are stored at the location addressed by the LPA bus 28a. |
| TR_OEABB<br>Control bus 21 | Signal to the 18502 register (30) which enables the TAG bus 28t to drive through onto the UPA bus 28b. |
| WRITETAGB | Signal to the 18502 register (30) which enables the UPA bus 28b to drive through onto the TAG bus 28t to be written into the Tag RAM device 19t. |
| UPA_OEABB | Signal to the 18502 register (29p) which enables the processor bus 14b to drive through data onto the UPA bus 28b to be written in the Tag RAM device 19t. |
| LPA_OEABB | Signal to the 18502 register (29p) which enables the LPA bus 28a to drive through onto the processor bus 14b for data read out from the Tag RAM device 19t. |
| ULPA_OEBAB | Signal to the 18502 register (29p) which enables the UPA bus 28b to drive through onto the processor bus 14b for data read out from the Tag RAM device 19t. |
| IVQ_OEB | Signal to the 18502 register (29s) which enables the secondary bus (27s) to drive through onto the UPA bus 28b and LPA bus 28a to source data and its address to the Tag RAM device 19t. |

The Control PAL 16 of FIG. 1, monitors and acts as a source for the parity bits on bus 18. When the RAM devices 19p and 19t are being read, the Control PAL 16 monitors both the data field TAG bus 28t and the parity bits on bus 18, in addition to checking for valid parity values. If a bad parity detection occurs, this results in an error condition which performs a standard error signal, but which is not relevant to the present system for initialization of known parity. When the RAM device 19t is being written to, on bus 28t, the Control PAL 16 generates the proper and accurate parity bit values from the data 2-byte address data field in Tag RAM 19t and sources these parity bit values to the parity RAM 19p for storage. During initialization time, it is important that the parity values be "proper" to indicate the accuracy of the information in the RAM's devices 19 and it is an object of this described system to rapidly provide data and parity values which are indicative of valid parity.

RAM Devices 19:

As seen in FIG. 1, there are two blocks (19p, 19t) of RAM elements which are shown. These devices are supportive of the Data RAM 19d. However, it is possible there nay be more than two and multiple numbers of RAM elements. In FIG. 1, there is seen the parity RAM 19p and the Tag RAM 19t. The Parity RAM holds 4 bits of parity (w,x,y,z) FIG. 4A, for the Tag (address) field in (19t) and its status bits. The Tag RAM 19t is the part of cache which holds address index pointers placed via bus 28t of FIG. 1.

The Tag RAM block 19t in this particular embodiment, stores 4K words of 18 bits each. For this Tag RAM block 19t, the address location in Tag RAM 19t is carried on the 12-bit LPA bus 28a which derives its data either from the processor bus 14b or the secondary spy bus 27s. The address data going into or out of the Tag RAM block 19t is carried on the 16-bit UPA bus 28b. The data to the Tag RAM 19t also travels to or from the indicated incoming busses shown as the processor bus 14b and the secondary bus 27s which is sourced from the system bus spy logic, 22s, FIG. 3C. In addition to control bits on lines 16c1 and 16c2 which are enabled to and from the Control PAL 16, it may be indicated that while the processor bus 14b and the secondary bus 27s are shown in this embodiment, it is possible to have more than these two external busses.

The second RAM block is the Parity RAM block 19p. In the embodiment shown in FIG. 1, this block is necessary since each address tag word, FIG. 4A, holds 18 bits that is stored in the Tag RAM block 19t, and these are used for their application and no bits are left to hold parity checking bits. Thus the parity RAM 19p provides for the parity structure for each of the 18 bits of address tag words and status stored in the Tag RAM 19t.

The parity RAM block 19p stores 4K, 4-bit words for holding parity on each of the address tag and status words stored in the Tag RAM block 19t. The parity RAM block 19p is addressed identically with the Tag RAM block 19t. Thus, in FIG. 1, the LPA Line Bus 28a is seen to provide an address to the Tag RAM 19t at the same time providing an address line connection to the parity RAM 19p. The Control PAL 16 then generates and checks the parity values for each one of the 18 bit address tag words in the Tag RAM of which there are 4,028.

RAM Parity:

The general purpose of "parity utilization" is to verify the validity of information (addresses) held in a RAM structure such as the Tag RAM 19t. Since RAM data can be potentially one of the weakest links in a system, therefore some useful method for ensuring data integrity is vital to reliable system operation. Thus, parity utilization is such a method of ensuring data integrity.

Figures 4A, 4B:
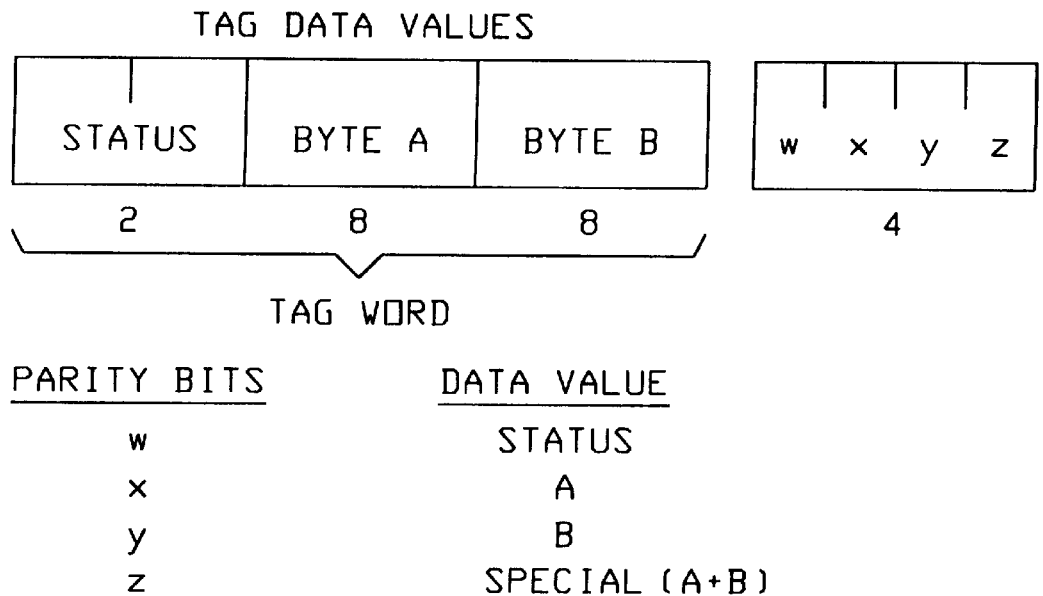
FIG. 4A is a drawing of the Tag address data values and the associated parity bits.
FIG. 4B shows the relationship of the address word data values to the parity bit values.

In the drawings of FIGS. 4A and 4B, it will be seen that 4 parity bits (w,x,y,z) are used to assure validity of the 18-bit Tag address word values which are held in the Tag RAM module 19t. Thus, as seen in FIG. 4A, the Tag data values show 2 bits for status, 8 bits for byte A and 8 bits for byte B. There are many possible methods which exist for using parity bits, however, FIGS. 4A and 4B show the relationships used in the example discussed herein. Thus, FIG. 4A shows the 16-bit Tag address word being broken logically into two logical parts, that is to say, the first data byte is denoted as Byte A, and the second data byte is denoted as Byte B, in addition to the two bits used for the "status" field. The associated four parity bits are denoted in FIG. 4A as w,x,y & z, respectively. Thus, as seen in the figure, the parity bit "w" corresponds to the status field, the parity "x" corresponds to the data byte A, then the parity bit "y" corresponds to the data byte B, and then the parity bit "z" is a special combination parity value for the combination of bytes A+B.

As is generally known in digital technology, either an odd or an even parity convention can be utilized. The example shown herein uses an odd parity version. Therefore, in each of the combinations of parity bits and data values given in FIGS. 4A and 4B, the total number of "one" bits must be an odd number in order to indicate the proper parity. If an odd number is not found when the parity values are checked, then a parity "error" is detected and the RAM data integrity is invalid for that tag word address word resident in the Tag RAM 19t.

As seen in FIG. 4B, the left-hand column shows the address data values while the right-hand column shows the parity bits value. Thus, the eight bits of byte A which are seen to be all zeros thus provide a parity bit of x=1 while byte B being all zeros provides a parity bit value of y=1. The status being 00 provides that the w parity bit be equal to "one" and the combination of A+B=1+1 would give a digital "zero" thus parity bit z=0.

RAM Parity Initialization:

Since parity is checked each time that the RAM structure 19 of FIG. 1 is "read," it is mandatory that each individual address word in the RAM structure 19t have a "valid" parity to begin with. The RAM structure 19t holds the 18-bit Tag address word while the RAM 19p holds the 4-bit parity values. Some applications may place a restriction that no RAM can be read before it is written, however, in many cases, this is an unenforceable situation.

In the embodiment and example described herein, a comment is required that the RAM 19 may be read BEFORE it may have been written. In this type example, the status bits (2 bits) stored as part of the Tag RAM word (FIG. 4A) must always have a "proper" value. The "status bits" tell the user modules of the RAM structure the nature of the word stored in the Tag RAM 19t. For example, the "status bits" indicate whether the particular word stored is a "valid cache word" or an "invalid cache word," for example. Therefore, the status bits must always have been initialized to a proper state before the system is allowed to utilized information from the RAM structure 19.

Since the digital system may read the Tag RAM structure 19 to view the status bits, the parity on the status is also checked at the time of the read. Therefore, not only the status bits must be "initialized" before using them but also the parity bit "w" (FIGS. 4A, 4B) also must have been "properly initialized" so as not give an "unknown" parity checking condition.

Since the Tag RAM 19t is read as an entire block, that is to say, both status bits and the tag field bytes A and B, the entire RAM should be properly initialized before it is used by the system operations. Thus, the remaining parity bits must also be initialized. In summary, in many applications, as in the example here cited, the RAM structures must be initialized to known values before it is safe to allow system operations to read out and write them in. Thus, the processes for initialization of a RAM structure with proper parity indicators, is the focus of the presently described system.

RAM Structure Initialization:

The initialization of any RAM structure, such as RAM structure 19 of FIG. 1, involves a sequence of "writes" into the RAM of known data values. This also involves cycling through all of the possible address locations which involve 4K addresses in this embodiment and example provided herein. After the addressing cycle, there is the writing of data into the RAM device. Normally the data portion of the RAM structure will be written with "zero" values even though it is possible to write into the RAM with any "known" value. In the present example, the status bits are initialized to a state that specifies "invalid cache data" which is indicated as equal to 00 on the status bits (w=1 in FIGS. 4A, 4B).

When the tag address data and the status bits are initialized to known values, the corresponding parity bits must be written to correspondingly known proper parity values to assure that the first read-out of the RAM will not get a full parity error indication. FIG. 4B shows the initialization values and FIG. 4B shows the bytes A, B and the status bits as being all zeros.

As an indication of what transpired in the prior art, it can be seen in FIG. 1 that all the devices in FIG. 1, with the exception of the RAM devices 19, are all JTAG compatible and are also "off-the-shelf" components. In FIG. 1, the dashed lines designated 12r indicate the serial JTAG connections (from Maintenance Subsystem 60 via Maintenance Controller 12) to various of the modules except the parity RAM 19p and the Tag RAM 19t. Those devices which are standard JTAG devices can be used with the maintenance means 60 which can shift into each of such devices certain values that can be driven out off the pins of these devices. Thus, for example, the transceiver register 29p can be used by the Maintenance Subsystem 60 to shift in a value that can then source that value into the UPA bus 28b and the LPA bus 28a. Also, the transceiver register 30 can be shifted into (via Jtag line 12r) by the maintenance controller and subsystem 60 with values that can be driven onto the Tag bus 28t. Further, the Control PAL 16 can be shifted by the Maintenance Subsystem to drive out the appropriate controls necessary to control the actions of the RAM devices 19p and 19t. Thus, it will be seen that, via the standard industry JTAG interface, the RAM devices 19 in FIG. 1, can be written to with any value that the Maintenance Subsystem 60 software wishes to shift into the transceiver register 30. Therefore, it is seen that the Maintenance Subsystem 60 (FIG. 3B) can use such a scheme to initialize the RAM structure as desired. These earlier methods operated rather consistently, but for large RAM arrays, such as the 4K array indicated in this embodiment, this older method was very slow and delayed the initialization of the system by several minutes of valuable time.

In the earlier methods, there was a sequence of steps that had to be taken by the Maintenance Subsystem 60 using the earlier methods to initialize the RAM structure such as RAM structure 19. These earlier sequences included the following:

(1) The Maintenance Subsystem 60 shifts the following control information into the Control PAL 16:
  (a) It sets the parity bits' outputs (w,x,y,z) to the initial values (=1110);
  (b) It sets the RAM device controls for writing the following:
    (b1) Set the Tag RAM write-enable TAG_WRB=0); (Table I)
    (b2) Set the parity RAM write controls (WRITESTA=1, PAR_WEB=0). (Table I)
(2) The Maintenance Subsystem 60 shifts the address value into the transceiver register 29p to source the Tag RAM's address location onto the LPA bus 28a.
(3) The Maintenance Subsystem shifts (via bus 28b) the Tag address data value (equal to zeros) into the transceiver register 30 to source write data onto the Tag bus 28t and into the Tag RAM 19t.
(4) The Maintenance Subsystem 60 must then determine the next address value, generally using a software counter.
(5) The Maintenance Subsystem then needed to repeat the loops (2) through (4) in the amount of 4K times in order to initialize the entire RAM structure with all the required data.

This prior art method of the sequence of loops actually was a workable system but was most painfully slow due to the slow shifting process required.

RAM Structure Initialization With Improved System:

As the previous earlier methodology suggested, the goal of RAM initialization was to put known data and the associated proper parity values into all of the addressable locations in the RAM structure, such as RAM structure 19. As indicated by the earlier art, this was done by the maintenance subsystem putting all possible address values on slow serial shift JTAG lines 12r, (FIG. 3C) leading to the RAM devices. In an earlier example, this was done via the use of the LPA bus 28a. Then putting known data values (typically all "zeros") onto the data bus to the RAM devices (such as the Tag bus 28t) was slowly affected. Further, the Maintenance Subsystem had to drive the appropriate bus 12r controls to the RAM devices 19 to cause them to write while also putting the necessary parity values on the parity bits in the parity RAM 19p.

The new system and method utilizes the same bus paths above, but accomplishes the same functions in a fraction of the time taken by the old serial shift oriented method. The new system and method uses special JTAG features in the transceiver register devices to achieve this functionality. This special JTAG feature in the transceiver registers involves the Boundary Scan Register (BSR) of FIG. 5 which can be operated as an "up-counter" in order to serve as source of counting values on the external busses 28a, 28b, and 28t.

Transceiver Register Device JTAG Logic: (29p, 29s, 30):

The subject transceiver registers are bi-directional bus transceivers which are implemented by the Intel 18502 devices. These devices are standard "off-the-shelf" units designated SN74ABT18502 chips manufactured by the Texas Instruments Company of Dallas, Tex. These chips such as 29p, 29s and 30 (FIG. 1) are fully JTAG compliant for maintenance purposes. The JTAG features of the transceiver registers 18502 enable a special utilization in the present system to accomplish the task of initializing a general RAM structure with proper parity values in a rapid, efficient manner which saves considerable time over prior systems.

Referring to FIG. 5, there is seen the internal logic of the transceiver receiver device 18502. Block 33a is the normal functional bi-directional register logic of the transceiver device. If the JTAG maintenance connections did not exist, then the block 33a is all that would be provided in the device. The register logic 33a takes the normal logic signal inputs and then generates the normal logic signal outputs as seen by the bi-directional arrows in FIG. 5, connected to the register logic 33a. For the transceiver register device 33 (18502), these normal logic signal inputs and outputs involve 18 signals on one side of the transceiver 33a and 18 signals on the other side.

Since the transceiver 33a is a bi-directional register, these signals may be input signals or output signals depending upon the direction of the flow selected. In addition to the two sets of 18 data signals, there are several control signals for "direction-enabling" and for controlling the driving out of data in contrast to tri-stating the outputs.

In FIG. 5 showing device 33, the shadowed units are the JTAG maintenance elements which are shown as the Boundary Scan Register 34a (BSR), the instruction register 34b, the boundary control register 34c, and the TAP controller 34d. In actuality, there may be additional JTAG elements present, but which are not necessary to the particular system described herein. Thus, in FIG. 5 there is seen the "Boundary Scan" Register (BSR) 34a. This is a shift register made of flip-flops that can monitor all the normal logic signal inputs and can also emulate these signals to the transceiver register logic 33a. The Boundary Scan Register BSR 34a can also monitor the outputs of the normal functional transceiver block 33a, as well as be a source for the normal signal outputs out of the register logic 33a. The Boundary Scan Register (BSR) 34a allows the Maintenance Subsystem 60 to "shift-in" data to source the data outputs from the transceiver 33a onto the various connecting busses.

In FIG. 5 there is also seen several registers which can also be "shifted-into" by the Maintenance Subsystem 60 by means of the "test data in" signal, TDI, 35a. One of the two registers of importance to the system is the "Instruction Register" 34b. The Maintenance Subsystem 60 can shift into the Instruction Register 34b various standardized instructions which will control certain subsequent maintenance actions in the transceiver 33a. For example, the Instruction Register 34b controls which information will be output and also controls the "Test Data Out" signal, TDO, 35b, back to the maintenance system 60. The Instruction Register 34b also controls which of the maintenance JTAG shift registers (BSR 34ap, BCR 34as, 34a3, FIG. 1) will be shifted to accept incoming maintenance data on the test data input line (TDI) 35a. Table II shown below indicate a partial listing of the Instruction Register OP CODES defined for the 18502 transceiver unit, 33, FIG. 5.

The Boundary Scan Register 34a of FIG. 5 is normally "transparent" to the normally operating logic in 33a. However, in the diagnostic JTAG mode, the BSR operates as a shift chain of flip-flops that can drive test data into or out of the chip device 33 in place of the normal operating logic signal. Thus, this allows the Maintenance Subsystem 60 (via Maintenance Controller 12) to shift data signals into the device to emulate data to be put onto the LPA bus (28a) and UPA bus (28b).

TABLE II

Instruction Register (34b) OP CODES for Transceiver 33 (FIG. 5)

| OPCODE | OPCODE NAME | DESCRIPTION | REGISTER SELECTED |
|---|---|---|---|
| 00 | EXTEST | drive BSR out of device | BSR (34a) |
| 81 | IDCODE | read device identification | ID register (not shown) |
| 82 | SAMPLE | sample device inputs to BSR | BSR (34a) |
| 09 | RUNT | run a boundary control test | BP register (not shown) |
| 0F | SCANCT | shift in & out of BCR (Boundary Control) | BCR (34c) |
| ... | | | |

The Boundary Control Register (BCR) 34c is a significant element utilized in the feature of the described system. The BCR 34c uses a 21-bit register which can be used by the Maintenance Subsystem 60 to cause the transceiver 33a outputs to operate in special "counting" ways or manners. Three bits of the BCR 34c can have special OP CODES shifted into them. The BCR (Boundary Control Register) OP of major significance to the present system is the "binary up-count mode". This "mode" causes the output flip-flops of the Boundary Scan Register 34a on the device output pins to act as a "binary up-counter". That is to say, it provides an ascending binary count on the output signals of the transceiver 33a (18502). Shown below is Table III which gives the OP CODES as defined for the Boundary Control Register, BCR 34c.

TABLE III

FIG. 5: Boundary Control Register (34c) OP CODES

| BCR (34c) OPCODES | DESCRIPTION |
|---|---|
| 000 | sample inputs/toggle outputs |
| 001 | pseudo random pattern generation |
| 010 | parallel signature analysis |
| 011 | simultaneous random pattern generation and parallel signature analysis |
| 111 | binary count up mode |

Further shown in FIG. 5 is a unit called the "TAP" controller 34d. This unit block monitors the standard JTAG control signals designated TMS (Test Mode Select) 35c and TCK (Test Clock) 35d from the Maintenance Subsystem 60 and the TAP controller also controls all of the internal shifting-into and shifting-out of the various JTAG registers shown in the shadowed portions 34a, 34b, 34c, 34d of FIG. 5. As previously mentioned, the JTAG is a diagnostic and testing concept which is used as an industry standard method. This concept is documented in the IEEE 1149.1 standards publication. The system and method described herein involved the utilization of this JTAG concept to accomplish in a very rapid time efficient way, the initialization of a large RAM structure with the proper parity values suitable for starting system operations with the proper parameters.

Figure 2:
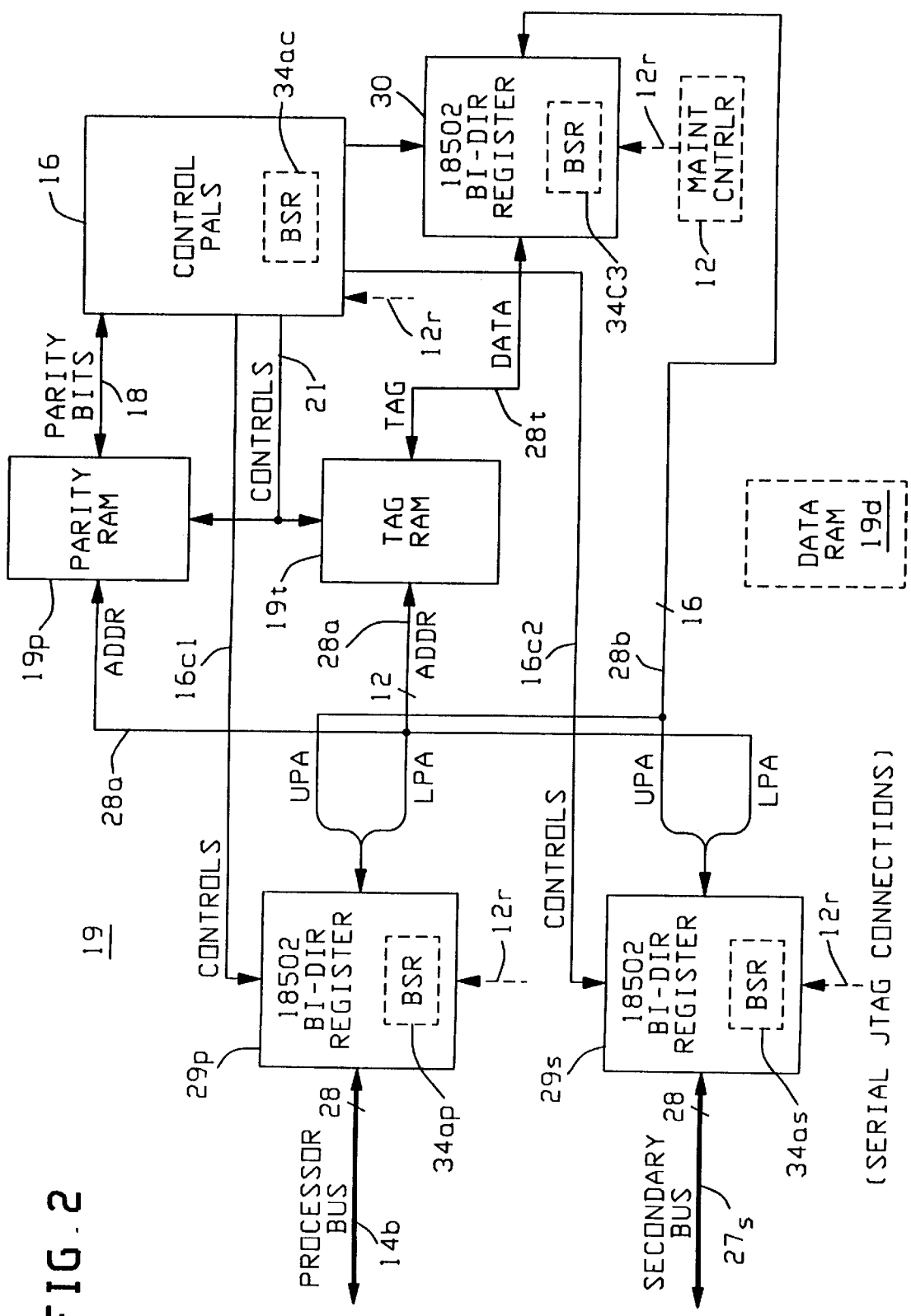
FIG. 2 is a clarified version of FIG. 1, illustrating the important paths which have been emphasized for ease of explanation.

High Speed Initialization of RAM Structure:

FIG. 2 is a similar drawing to FIG. 1 with specialized highlighting of important pathways for greater clarification. The two shaded transceiver 18502 devices 29p and 30 are used by the Maintenance Subsystem 60 to drive data onto the busses which are shown in heavier ink as 28a and 28t.

Improved High-Speed Method for Initialization of RAM Structure:

Referring to FIG. 2, there is an emphasized version of FIG. 1 showing certain important data paths highlighted for ease of description and clarification. The two shaded transceiver registers 29p and 30 devices are used by the Maintenance Subsystem 60 to drive Tag address data onto the busses 28a and 28t, which are emphasized with darker, heavier lines. The transceiver 29p will source the locational address values necessary for initialization to the RAM structure 19 which include the Tag RAM 19t and the parity RAM 19p. The transceiver 29p will drive its own personal Boundary Scan Register (34ap, FIG. 2) under Maintenance Subsystem control onto the LPA bus 28a, causing the Tag RAM 19t and the parity RAM 19p to cycle through all the required address values.

The shaded block in FIG. 2 showing the transceiver 30 will source the write Tag address data values (all "zeros" is a satisfactory value) onto the Tag bus 28t. These values will be written into all the locations in the Tag RAM 19t. All zeros will be shifted into the Boundary Scan Register BSR 34a3, FIG. 2 (FIG. 5 detail) by the Maintenance Subsystem 60 and then this data will be driven out onto the Tag bus 28t into Tag RAM 19t. The input lines 12r in FIG. 2 are the normal serial JTAG maintenance connections to JTAG compatible devices.

In FIGS. 1, 2, the Control PAL 16 will "source" the parity bits; via bus 18 to the parity RAM 19p at each addressed location. The Control PAL 16 will also force out the necessary control signals on line 21 to enable the RAM devices 19 to function on their write cycles. The Maintenance Subsystem 60 will shift into the Boundary Scan Register (34ac) of the Control PAL 16, the appropriate parity values and control bit values.

Thus, in earlier systems, "each" locational address value (for sending 4K addresses) had to be calculated by the Maintenance Controller 12 and then shifted (via busses 12c 12r of FIG. 3C) into transceiver 29p (FIGS. 1, 2) to provide each locational address for the RAM structure 19 (19t and 19p).

In the improved system, the transceiver 29p (FIGS. 1, 2) needs only an original address to automatically start operating as an up-counter to act as source for each address location in RAMs 19t and 19p.

In this respect, the paths, the Tag Address data values, the locational address values and control signals are used as seen to follow the earlier methods for initializing the RAM structures 19. However, as noted in the earlier methods, the Maintenance System 60 had to calculate and shift-in every one of the possible address values into the RAM structures, which in the instant case involved 4K addresses. Since the shifting procedure via the serial interface 60si (FIG. 3C) is relatively slow, and since the Maintenance Subsystem overhead is quite considerable, the total loop actions necessary to initialize all the RAM locations via Maintenance Control 12 acted to delay system initialization for a significant period of time, on the order of several minutes.

The present improved system uses all of the normal path connections (which are not added for initialization), but however, uses the special feature of the transceiver 29p (18502) JTAG logic to provide all the necessary RAM address values in a very rapid "automatic loop", that is to say, no maintenance subsystem intervention is required or necessary once the loop is started.

As was seen, the transceiver devices (FIG. 5) have a JTAG__BCR OP CODE (Table III Boundary Control Register) that provided for "binary up counter" operation. Using this, the system can automatically provide the sequence of addressing. The transceiver device 29p will be placed in a special maintenance operation by the Maintenance Subsystem 60. When the Maintenance Subsystem shifts in the "RUNT" (Run a Boundary Control Test) instruction (Table II), then the BSR (34ap) outputs (onto the LPA bus 28a), and will then operate and count as a binary-up counter at each clock (TCK) time. In the embodiment of the presently described system, the TCK (maintenance clock) runs at 4 MHz. Thus, it will be seen, that for all 4K possible locational address values to have been transferred on the LPA bus 28a, the loop will only take 1 millisecond.

The transceivers 29p (also 29s, 30) acts as an isolation device between two different busses and also acts as a temporary holding register for data coming in or going out.

The RAM devices 19 used in the present embodiment are clocked and operate at a 32 MHz rate. If the write-enable signals to the RAM devices 19 and the input data (on Tag bus 28t and the parity bits on lines 18) are held "on" and stable, then the RAM devices 19 will be written into 3 or 4 times for each individual address value as the system loops through its binary count.

The Maintenance Subsystem 60 needs only to set up the write data (on the Tag bus 28t and the parity bits on line 18) together with the proper control signals. It does this by shifting in the proper values once and only once. The Maintenance Subsystem 60 will put the transceiver devices 29p, 29s, the Control PAL 16, the transceiver 30 into the "EXTEST" mode shown in Table II. In this maintenance mode, the EXTEST will drive out the shifted BSR values onto the connection busses and signals shown in FIG. 5 via bus 36 to bus 14b or 28a. Then the Maintenance Subsystem

60 will set up the transceiver 29p to run the BCR "binary count" operation. Once the Maintenance Subsystem 60 starts up the counting loop via the "RUNT" (Run a Boundary Control Test) instruction (Table II), it need only wait a few milliseconds to assure that all address locations have been written to (and actually written to several times). Then the Maintenance Subsystem 60 can terminate the loop and end the driving of data to the RAM devices 19. Thus, this action takes only one shifting procedure. In the new and improved system and method, the following indicates the sequence of steps that must be taken by the Maintenance Subsystem in using the improved method in order to initialize the RAM structure 19 and to set the proper original parity values:

1. Shift control signal information into the Control PAL 16:
   (a) Set parity bits (w,x,y,z,) to initial values (=1110);
   (b) Set RAM device controls for writing:
      (b1) Set Tag RAM write-enable (TAG_WRB=0);
      (b2) Set Parity RAM write controls (WRITESTA=1; PAR_WEB=0);
   (c) Shift Control PAL 16 into "EXTEST" instruction mode.
2. Shift data value (=all zeros) into transceiver 30 to source write data onto the Tag bus 28t over to the Tag RAM 19t. Shift transceiver 30 into "EXTEST" instruction mode.
3. Shift transceiver 29p to cause it to count and then drive address values onto the LPA bus 28a.
   (a) Shift BCR OP "binary up counter" operation;
   (b) Shift into "RUNT" instruction mode.
4. Wait about 2–3 milliseconds.
5. Terminate operation by shifting all devices back into their "normal run" state (not test state).

Described herein has been a system and method which provides the facility for a Maintenance Subsystem to initialize a sizeable RAM array to known values at the same time providing the proper parity values in a fraction of the time that the previous standard JTAG shifting was able to provide. In the method disclosed herein, no new hardware was needed or added to provide this capability. All the connections, data paths and controls to the RAM structure were normally present and necessary for the normal functional operation of the logic. Further, no special hardware devices were added. The transceiver register devices (18502) used in this system are normally present and necessary for normal bus control and signal steering in the normal functional operation of this type of logic. The special "binary up-count" feature of the transceiver 18502, that is utilized herein, is standard in many industry available JTAG parts. But noticeably, the invention shown herein saves many hundreds of seconds and several minutes of time that previously was wasted each time that the system was started up. For the proper operation of RAM structures which have the proper parity checking capability, the initialization time is very important and it is necessary that it be done expeditiously and accurately and properly.

While one particular embodiment of the above described system and method for fast initialization and correct parity values for RAM devices has been illustrated, it should be understood that other embodiments may also operate using the concept developed in the above invention and as defined in the following claims.

What is claimed is:

1. A method for loading a Tag RAM and associated Parity RAM of a cache module with initial proper parity values comprising the steps of:

(a) loading Tag address words into each address location of a Tag RAM while also loading the correct parity value for each address word into an associated Parity RAM;
   (b) utilizing the JTAG boundary scan register in a first bi-directional transceiver means to perform as up-counter to sequence through each address location in said Tag RAM and said Parity RAM;
   (c) providing initially correct parity values to said Parity RAM for each byte of each 2 byte Tag address word and its two status value bits.

2. The method of claim 1 wherein step (c) includes the steps of:
   (c1) calculating via a Control PAL, parity bit values x, y, w, z, respectively, for the first byte, the second byte, the 2-bit status value, and sum of the first and second bytes, of each said Tag address word;
   (c2) placing said parity bits w, x, y, z, in each addressed location of said Parity RAM.

3. The method of claim 1, wherein step (b) includes the steps of:
   (b1) instructing, via a Maintenance Controller and Maintenance Subsystem, a boundary control register in said first transceiver means to convert said boundary scan register into an up-counter to sequence through each address location in said Tag RAM and Parity RAM.

4. In a computer network where a maintenance subsystem initiates the initial writing into a Central Processing Module (CPM) having a maintenance controller which uses serial JTAG lines, for diagnostic purposes, to internal logic units in said CPM, a system for writing into a cache module to insure that the parity bits for address data in its Tag RAM are correctly initiated, comprising:

(a) said internal CPM logic units including:
      (a1) a cache module (19) having a Tag RAM unit (19t), a Parity RAM unit (19p) and Data RAM unit (19d);
      (a2) a Control PAL 16 Programmable Array Logic Control unit for regulating the input and output of data to/from said cache module, said Control PAL 16 being initiated by said maintenance controller (12);
      (a3) a central processor unit (14) connected to access said cache module and a data path array interface;
      (a4) said data path array interface (20) providing dual system bus connections to a main memory module (40) and Input/Output module (50);
      (a5) said maintenance controller (12), initiated by said Maintenance Subsystem 60, for controlling Boundary Scan Registers in first, second and third transceivers;
   (b) said first transceiver means (29p) for receiving address data from a processor means 14 to target corresponding locations in said Tag RAM (19t) and said Parity RAM (19p), and including:
      (b1) a first Boundary Scan Register (34ap), initiated by said Control PAL (16) via said Maintenance Controller (12), to sequence locational address values through said Tag RAM (19t) and Parity RAM (19p);
   (c) said third transceiver means (30) for sending and receiving Tag address data words to/from said Tag RAM (19t) and to/from said second transceiver means (29s), said third transceiver means (30) including:
      (c1) a third boundary scan register (34a3) initiated by said Control PAL (16) and Maintenance Controller (12);
   (d) said Maintenance Controller 12 for initiating said first Boundary Scan Register (34ap) in said first transceiver means (29*p*) to operate as an up-counter for sequencing locational addresses to said Tag RAM (19*t*) and said Parity RAM 19*p* said Maintenance Controller including:

(d1) means to initiate said third transceiver means Boundary Scan Register (34*a*3) to convey Tag address word values to said Tag RAM 19*t* for each location addressed;

(e) said Control PAL (16) for calculating the parity values for each Tag address data word value placed in each address location in said Tag RAM (19*t*), including:

(f1) means to place said calculated parity values into each location in parity RAM (19*p*) that corresponds to a locational address in said Tag RAM (19*t*);

(f2) each Tag address word value consisting of a first byte, a second byte, and a status value of two bits;

(f3) means to place in each corresponding address location of said Parity RAM (19*p*) a parity bit "x" for said first byte, a parity bit "y" for said 2nd byte, a parity bit "w" for said 2-bit status value, and a parity bit "z" for the sum of parities of said first and second bytes.

5. The system of claim 4 which includes:

(a) said second transceiver means (29*s*) for receiving Tag address data words from a spy logic means (22*s*) for transfer to said third transceiver means (30) which conveys said Tag address data words into said Tag RAM.

6. A method for rapidly loading a Tag RAM with Tag address values for each location and for correctly placing proper parity values for each corresponding address location in a Parity RAM comprising the steps of:

(a) shifting control information from a Maintenance Subsystem into a Control PAL unit;

(b) setting, via said Control PAL, parity bits for each locational address in said Parity RAM to the proper initial values;

(c) enabling said Tag RAM for being written into;

(d) enabling a Boundary Scan Register in said Control PAL to drive out data (EXTEST);

(e) shifting Tag address values of all zeros into each location of said Tag RAM, using a first bi-directional transceiver register means;

(f) setting said first transceiver register means into a condition to drive out data (EXTEST Mode);

(g) enabling a second transceiver register means to perform as an up-counter to address each location in said Tag RAM and Parity RAM;

(h) shifting an instruction register in said second transceiver register means into a boundary control test mode (RUNT) for 2–3 milliseconds;

(i) shift all devices for their test state into normal run state.

7. A system for rapidly loading a Tag RAM with Tag address data words and loading an associated Parity RAM with parity bits for each Tag address data word comprising:

(a) said Tag RAM having multiple locations wherein each location stores a Tag address data word having 2 bytes and 2 status bits;

(b) said Parity RAM having corresponding multiple locations storing 4 parity bits for each Tag address word;

(c) bi-directional transceiver means having a JTAG boundary scan register functioning as an up-counter to sequence all the locational addresses in said Tag RAM and Parity RAM;

(d) Control PAL means to calculate the proper parity bits for each Tag address word placed in said Tag RAM including:

(d1) means to place said proper parity bits in each Parity RAM address corresponding to the Tag RAM address location;

(e) maintenance controller means to initiate said boundary scan register into an up-counter mode of operation.

* * * * *